United States Patent
Choi et al.

(10) Patent No.: US 7,894,006 B2
(45) Date of Patent: Feb. 22, 2011

(54) LIQUID CRYSTAL DISPLAY WITH M X 1 INVERSION DRIVE

(75) Inventors: Jin-Young Choi, Seoul (KR); Seok-Je Seong, Yongin-si (KR); Jin Jeon, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 465 days.

(21) Appl. No.: 11/774,716

(22) Filed: Jul. 9, 2007

(65) Prior Publication Data
US 2008/0018815 A1 Jan. 24, 2008

(30) Foreign Application Priority Data
Jul. 24, 2006 (KR) ................... 10-2006-0068931

(51) Int. Cl.
G02F 1/141 (2006.01)
G02F 1/1335 (2006.01)
G09G 3/18 (2006.01)
G09G 3/36 (2006.01)

(52) U.S. Cl. ............................ 349/37; 345/54; 349/137
(58) Field of Classification Search .................. 349/37, 349/107, 109, 54; 345/54
See application file for complete search history.

(56) References Cited

U.S. PATENT DOCUMENTS

| | | | |
|---|---|---|---|
| 6,038,002 A | 3/2000 | Song | |
| 6,249,326 B1 * | 6/2001 | Hebiguchi | ................... 349/42 |
| 2003/0043328 A1 | 3/2003 | Hayashi | |
| 2004/0109122 A1 * | 6/2004 | Kumagawa et al. | ......... 349/143 |
| 2004/0233343 A1 * | 11/2004 | Baek | ............................ 349/38 |
| 2005/0036091 A1 * | 2/2005 | Song | ........................... 349/129 |
| 2005/0041006 A1 | 2/2005 | Lee et al. | |
| 2005/0068281 A1 * | 3/2005 | Shin et al. | ...................... 345/88 |
| 2005/0167669 A1 | 8/2005 | Kim et al. | |

(Continued)

FOREIGN PATENT DOCUMENTS

EP 0752611 A2 1/1997

(Continued)

OTHER PUBLICATIONS

European Search Report for Application No. EP07013180; Search Completion Date: Sep. 11, 2007.

*Primary Examiner*—Mark A Robinson
*Assistant Examiner*—Michael Inadomi
(74) *Attorney, Agent, or Firm*—Cantor Colburn LLP

(57) ABSTRACT

A liquid crystal display (LCD) includes a substrate, gate lines, data lines, thin film transistors and pixel electrodes. The gate lines are formed on the substrate and cross the data lines. The thin film transistors are connected to the gate and data lines, and each thin film transistor includes a drain electrode. The pixel electrodes are connected to the thin film transistors and are arranged in a matrix, and each of the pixel electrodes has a first side disposed in parallel with the gate lines and a second side adjacent to the first side and shorter than the first side. In the LCD, the predetermined portion of each of the drain electrodes is overlapped with only one of two adjacent pixel electrodes if the polarities of the adjacent pixel electrodes are different, and the predetermined portion of each of the drain electrodes is overlapped with both of the adjacent pixel electrodes if the polarities are the same.

15 Claims, 9 Drawing Sheets

U.S. PATENT DOCUMENTS

| | | |
|---|---|---|
| 2006/0061700 A1* | 3/2006 | Chung et al. ............... 349/38 |
| 2006/0061711 A1* | 3/2006 | Lee et al. ................ 349/106 |
| 2006/0066797 A1* | 3/2006 | Baek ...................... 349/139 |
| 2006/0131585 A1 | 6/2006 | Kim et al. |
| 2007/0263134 A1* | 11/2007 | Kim et al. ................. 349/54 |

FOREIGN PATENT DOCUMENTS

| | | |
|---|---|---|
| JP | 2001222027 | 8/2001 |
| JP | 2002303873 | 10/2002 |
| JP | 2003330037 | 11/2003 |
| JP | 2006017897 | 1/2006 |
| KR | 1020020056675 | 7/2002 |
| KR | 1020030029218 | 4/2003 |
| KR | 1020040006554 | 1/2004 |
| KR | 1020040031370 | 4/2004 |
| KR | 1020040076721 | 9/2004 |
| KR | 1020060023699 | 3/2006 |

* cited by examiner

LIQUID CRYSTAL DISPLAY WITH M X 1 INVERSION DRIVE

This application claims priority to Korean Patent Application No. 10-2006-0068931, filed on Jul. 24, 2006, and all the benefits accruing therefrom under 35 U.S.C. §119, the contents of which in its entirety are herein incorporated by reference.

BACKGROUND OF THE INVENTION (a) Field of the Invention

The present invention relates to a liquid crystal display. More particularly, the present invention relates to a liquid crystal display having fewer data driving circuits, and which prevents cross-tall, generated during column inversion driving.

(b) Description of the Related Art

A liquid crystal display is one of the most widely used flat panel displays. The liquid crystal display includes two display panels each having field-generating electrodes such as a pixel electrode and a common electrode, and a liquid crystal layer interposed therebetween. The liquid crystal display induces an electric field in the liquid crystal layer by applying a voltage to the field generating electrodes, and determines the alignment of liquid crystal molecules of the liquid crystal layer to control polarization of incident light through the display panels, thereby displaying an image.

The liquid crystal display also includes a plurality of signal lines such as gate lines and data lines in order to supply a voltage to a respective pixel electrode by controlling a switching element connected to the respective pixel electrode. The gate line transfers a gate signal generated from a gate driving circuit, and the data line transfers a data voltage generated from a data driving circuit. The switching element transfers a data voltage to the respective pixel electrode according to the gate signal.

The gate driving circuit and data driving circuit are directly mounted on one of the two display panels in the form of a plurality of integrated circuit ("IC") chips. Alternatively, the gate driving circuit and data driving circuit are mounted on a flexible circuit layer and the flexible circuit layer is attached to one of the display panels. Such an IC chip is responsible for a large percentage of a manufacturing cost of a liquid crystal display. Particularly, since the data driver IC chip is much more expensive than a gate driving circuit IC chip, it is necessary to reduce the number of IC chips for a high resolution and large-sized liquid crystal display. The manufacturing cost of the gate driving circuit can be reduced by integrating the gate driving circuit with the display panel having the gate lines, data lines and switching elements. However, it is very difficult to integrate the data driving circuit with the display panel because the data driving circuit has a complicated structure. Therefore, a reduction of the number of data driver ICs is required.

BRIEF SUMMARY OF THE INVENTION

The present invention has been made in an effort to provide a liquid crystal display having features, aspects and advantages of reducing the number of data driving circuit IC chips and preventing cross-talk generated during column inversion driving.

An exemplary embodiment of the present invention provides a liquid crystal display including: a substrate, a plurality of gate lines, a plurality of data lines, a plurality of thin film transistors and a plurality of pixel electrodes. The gate lines are formed on the substrate, and the data lines cross the gate lines. The thin film transistors are connected to the gate lines and the data lines, and each thin film transistor includes a drain electrode. The pixel electrodes are connected to the thin film transistors and arranged in a matrix, and each of the pixel electrodes includes a first side disposed in parallel with the gate lines and a second side adjacent to the first side and shorter than the first side. In the liquid crystal display, a predetermined portion of each the drain electrodes are disposed between adjacent pixel electrodes. The predetermined portion of the drain electrodes are overlapped with only one of the adjacent pixel electrodes if the polarities of the adjacent pixel electrodes are different, and the predetermined portion of the drain electrodes are overlapped with both of the adjacent pixel electrodes if the polarities of the adjacent pixel electrodes are the same.

The polarity of the pixel electrodes may be driven in an m×1 inversion-drive manner.

In exemplary embodiments, the m may be 3.

The liquid crystal display further includes a storage electrode line overlapped with respective pixel drain electrodes.

A predetermined portion of each of the drain electrodes and the storage electrode lines may be disposed between adjacent pixel electrodes in a column direction.

Each of the pixel electrodes may cover a previous gate line.

The liquid crystal display may further include an organic layer formed between the pixel electrodes and the data lines, and between the pixel electrodes and the gate lines.

The length of the first side may be three times longer than that of the second side.

The liquid crystal display may further include a gate driver connected to the gate lines, wherein the gate driver may be placed at the same layer as the gate lines, the data lines and the thin film transistors.

Another exemplary embodiment of the present invention provides a liquid crystal display which includes a substrate, a plurality of gate lines, a plurality of data lines, a plurality of thin film transistors, and first, second and third pixel electrodes. The gate lines are formed on the substrate, and the data lines cross the gate lines. The thin film transistors are connected to the gate lines and the data lines. The first, second, and third pixel electrodes are connected to the thin film transistors, respectively, and are adjacent in a column direction. Each of the first to third pixel electrodes has a first side disposed in parallel with the gate lines and a second side adjacent to and shorter than the first side. Polarities of the second and third pixel electrodes are the same, and the polarity of the first pixel electrode is opposite to the polarity of the second and third pixel electrodes. A first drain electrode is disposed between the first and second pixel electrodes, and a second drain electrode is disposed between the second and third pixel electrodes. The first drain electrode is overlapped only with the first pixel electrode of the first, second and third pixel electrodes, and the second drain electrode is overlapped with both of the second and third pixel electrodes.

The liquid crystal display may further include a storage electrode line overlapped with corresponding pixel and drain electrodes.

Each of the pixel electrodes may cover a previous gate line.

The liquid crystal display may further include an organic layer formed between the pixel electrodes and the data lines, and between the pixel electrodes and the gate lines.

The length of the first side is three times longer than the length of the second side.

The liquid crystal display may further include a gate driver connected to the gate lines, and the gate driver may be placed at the same layer as the gate lines, the data lines and the thin film transistors.

BRIEF DESCRIPTION OF THE DRAWINGS

Features aspects and advantages of the present invention will be made apparent by describing exemplary embodiments of the present invention with reference to the accompanying drawings, in which.

DETAILED DESCRIPTION OF THE INVENTION

Figure 1:
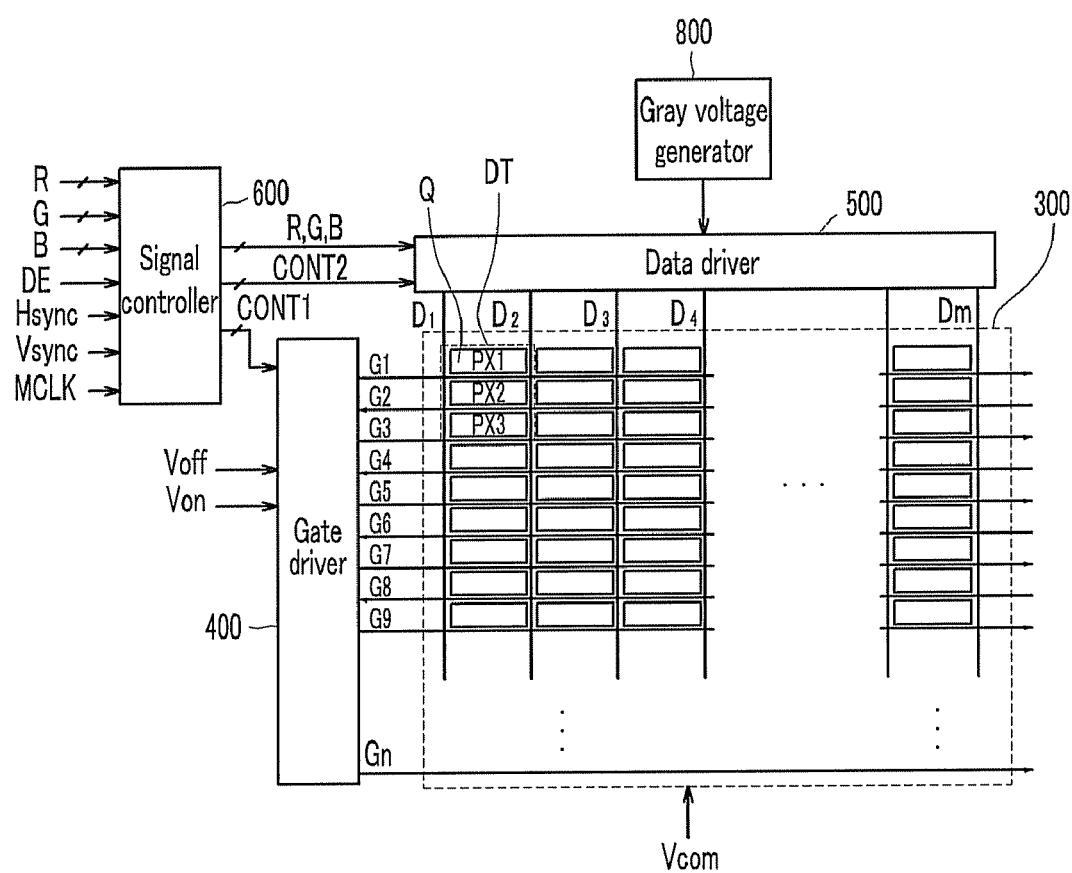
FIG. 1 is a block diagram illustrating a liquid crystal display according to an exemplary embodiment of the present invention.

The present invention will be described more fully hereinafter with reference to the accompanying drawings, in which exemplary embodiments of the invention are shown. As those skilled in the art would realize, the described exemplary embodiments may be modified in various different ways, all without departing from the spirit or scope of the present invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

Hereinafter, a liquid crystal display according to an exemplary embodiment of the present invention will be described with reference to FIG. 1 and FIG. 2.

FIG. 1 is a block diagram illustrating a liquid crystal display according to an exemplary embodiment of the present invention. FIG. 2 is an equivalent circuit diagram illustrating a pixel of a liquid crystal display according to an exemplary embodiment of the present invention.

Figure 2:
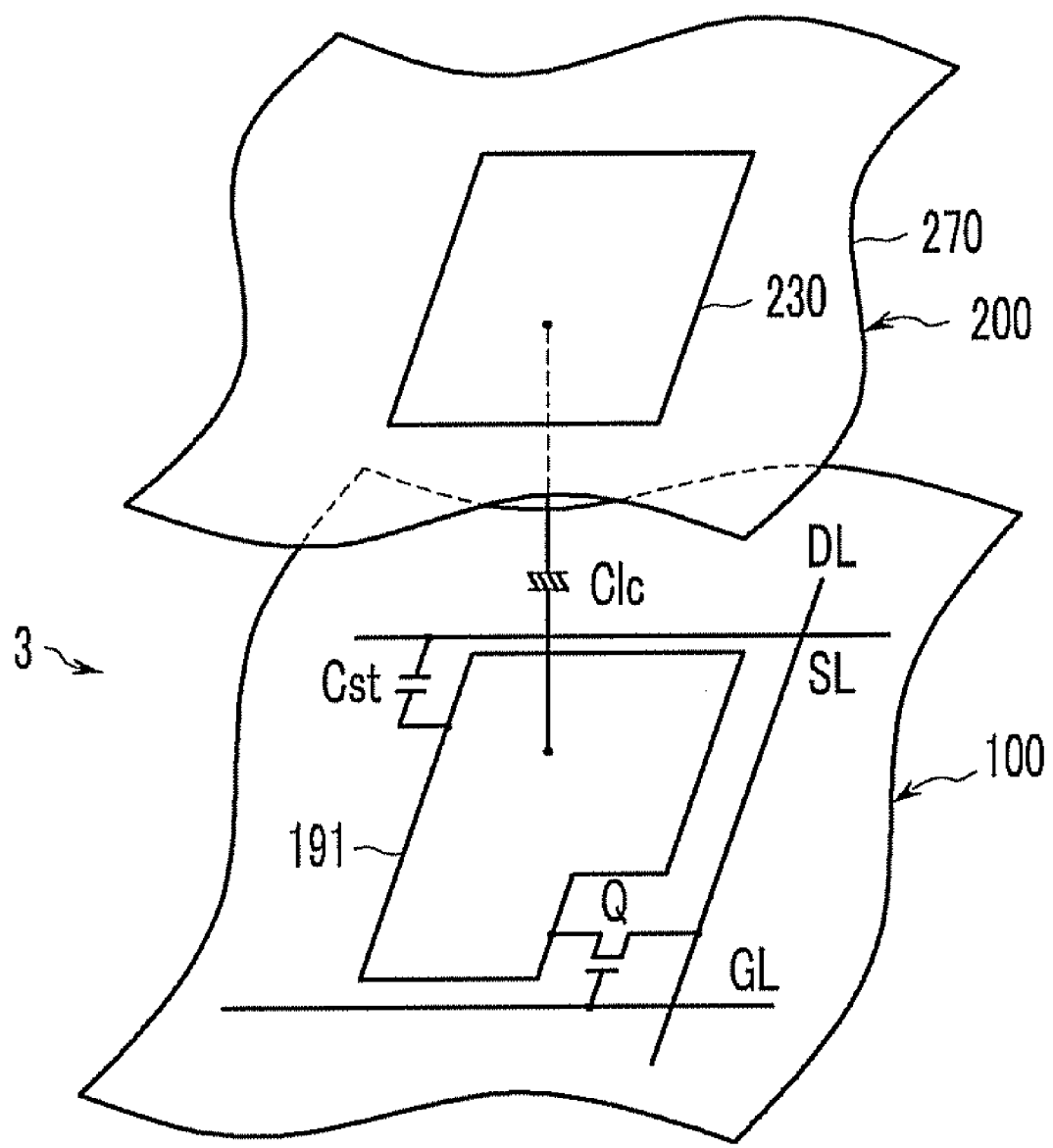
FIG. 2 is an equivalent circuit diagram of one pixel of a liquid crystal display according to an exemplary embodiment of the present invention.

Referring to FIG. 1 and FIG. 2, the liquid crystal display according to an exemplary embodiment of the present invention includes a liquid crystal panel assembly 300, a gate driver 400 and data driver 500 connected to the liquid crystal panel assembly 300, a gray voltage generator 800 connected to the data driver 500, and a signal controller 600 for controlling the drivers 400 and 500.

The liquid crystal panel assembly 300 includes a plurality of display signal lines and a plurality of pixels PX1, PX2 and PX3 connected to display signal lines and arranged in a matrix shape. Further, the liquid crystal panel assembly 300 includes a liquid crystal layer 3 interposed between lower and upper panels 100 and 200 facing each other as shown in FIG. 2.

The signal lines $G_1$-$G_n$, $D_1$-$D_m$ include a plurality of gate lines $G_1$-$G_m$ transferring a gate signal (or a scanning signal) and a plurality of data lines $D_1$-$D_n$ transferring a data signal.

The gate lines $G_1$-$G_n$ extend substantially in a row direction in parallel with each other, and the data lines $D_1$-$D_m$ extend substantially in a column direction in parallel with each other, as illustrated in FIG. 1.

Each of the pixels PX1, PX2 and PX3 has a longitudinal structure in the row direction. For example, the pixels PX1, PX2, and PX3 connected to the gate line GL and the data line DL include a switching element Q connected to signal lines GL and DL, and a liquid crystal capacitor Clc and a storage capacitor Cst connected thereto. However, the storage capacitor Cst can be omitted according to need in alternative exemplary embodiments.

The switching element Q is a three-terminal element such as a thin film transistor disposed at the lower panel 100. The switching element Q includes a control terminal connected to the gate line GL, an input terminal connected to a data line DL and an output terminal connected to a liquid crystal capacitor Clc and a storage capacitor Cst.

The liquid crystal capacitor Clc uses a pixel electrode 191 at the lower panel 100 and a common electrode 270 at the upper panel 200 as two terminals, and a liquid crystal layer 3 between two electrodes 191 and 270 functions as a dielectric material. The pixel electrode 191 is connected to the switching element Q. The common electrode 270 is formed on the entire surface of the upper panel 200 and receives a common voltage Vcom. Unlike FIG. 2, a common electrode 270 can be formed at the lower panel 100. In this case, at least one of the two electrodes 191 and 270 can be made in a line shape or a rod shape.

A storage capacitor Cst functioning as a subsidiary of the liquid crystal capacitor Clc is formed of a sustaining electrode line SL overlapping a pixel electrode 191 with an insulator interposed therebetween. A predetermined voltage such as a common voltage Vcom is applied to the additional signal line. The storage capacitor Cst can be formed of a pixel electrode 191 overlapping a previous gate line with an insulator as a medium.

In order to embody color display, each of the pixels PX1-PX3 displays a unique primary color (spatial division), or alternatively, each of the pixels PX1-PX3 displays different primary colors according to time (temporal division), thereby displaying desired colors through a spatial or temporal sum of these primary colors. For example, the primary colors are three primary colors, red, green and blue. FIG. 2 shows a color filter 230 displaying one of the primary colors on a region of an upper panel 200 corresponding to the pixel electrode 191 by each of the pixels PX1-PX3 as an example of spatial division. Unlike that shown in FIG. 2, a color filter 230 can be formed below a pixel electrode 191 of the lower panel 100. Color filters 230 for one primary color of pixels PX1-PX3 adjacent in a row direction extend in a row direction and are connected to one another, and color filters 230 for different colors are alternately arranged in a column direction.

It is assumed that each color filter 230 uniquely displays one of a red, green and blue color throughout the specification. A red pixel is a pixel with a red color filter 230, a green pixel is a pixel with a green color filter 230 and a blue pixel is a pixel with a blue color filter 230. The red pixel, blue pixel and green pixel are sequentially and alternately arranged in a column direction.

As described above, the pixels PX1-PX3 of three primary colors form one dot (DT) as a basic unit of an image (see FIG. 1).

Referring to FIG. 1 again, the gate driver 400 is integrated with the liquid crystal panel assembly 300 along with the signal lines $G_1$-$G_n$, $D_1$-$D_m$ and the thin film transistor switching elements Q. The gate driver 400 is formed at the left side and the right side of the liquid crystal panel assembly 300 (only the left side gate driver 400 shown in FIG. 1). The gate driver 400 applies a gate signal formed of a combination of a gate-on voltage Von and a gate-off voltage Voff. The gate driver 400 can be mounted directly on the liquid crystal assembly 300 as an IC chip. Alternatively, the gate driver 400 can be mounted on the liquid crystal panel assembly 300 in a tape carrier package ("TCP") type by being mounted on a flexible printed circuit film, or can be mounted on an additional printed circuit board ("PCB").

At least one polarizer (not shown) is attached at the outer surface of the liquid crystal panel assembly 300 for polarizing the light.

The gray voltage generator 800 generates two gray voltage sets (or reference gray voltage sets) related to a transmittance of a pixel PX. One of the two sets has a positive value and the other has a negative value relative to a common voltage Vcom.

The data driver 500 is connected to data lines $D_1$-$D_m$ of the liquid crystal panel assembly 300, selects a gray voltage from the gray voltage generator 800, and supplies the selected gray voltage to the data lines $D_1$-$D_m$ as a data signal. When the gray voltage generator 800 only provides a predetermined number of reference gray voltages instead of supplying gray voltages for all grays, the data driver 500 generates a gray voltage for all grays by dividing the reference gray voltage and selects one among them. The data driver 500 can be mounted directly on a liquid crystal panel assembly 300 as an IC chip. Alternatively, the data driver 500 can be attached on the liquid crystal panel assembly 300 as a TCP by being mounted on a flexible printed circuit film (not shown), or mounted on an additional PCB. However, the data driver 500 can be integrated with the liquid crystal panel assembly 300 with the signal lines $G_1$-$G_n$ and $D_1$-$D_m$ and the thin film transistor switching elements Q.

The signal controller 600 controls the gate driver 400 and the data driver 500.

Hereinafter, the operation of such a liquid crystal display according to the present exemplary embodiment will be described in more detail.

The signal controller 600 receives an input control signal from an external graphics controller (not shown) for controlling display of input image signals R, G and B. The input image signals R, G and B have information about luminance of each pixel PX. The luminance has a predetermined number of grays, for example, 1024 ($=2^{10}$), 256 ($=2^8$) or 64 ($=2^6$). For example, the input control signal includes a vertical synchronization signal Vsync, a horizontal synchronizing signal Hsync, a main clock signal MCLK, a data enable signal DE, etc.

The signal controller 600 receives an input control signal from the external graphics controller (not shown) for controlling the display of input image signals R, G and B, and processes the received input control signal to be suitable to an operating condition of the liquid crystal panel assembly 300. Then, the signal controller 600 generates a gate control signal CONT1 and a data control signal CONT2, and outputs them to the gate driver 400 and data driver 500, respectively. The image signal processing of the signal controller 600 includes an operation for rearranging the input image signals R, G and B according to the arrangement of the pixels.

The gate control signal CONT1 includes a scanning start signal STV for ordering start of scanning and at least one clock signal for controlling the output cycle of the gate-on voltage (Von). The gate control signal CONT1 can further include an output enable signal OE that limits a time duration of the gate-on voltage Von.

The data control signal CONT2 includes a horizontal synchronization start signal STH for notifying beginning of digital image signal DAT transmission to one column of pixels, and a load signal LOAD and a data clock signal HCLK for ordering load of an analog data signal to the data lines $D_1$-$D_m$. The data control signal CONT2 can further include an inversion signal RVS which inverts a voltage polarity of an analog data signal for a common voltage Vcom. Hereinafter, the data signal polarity denotes the voltage polarity of a data signal for a common voltage.

The data driver 500 receives a digital image signal DAT for a column of pixels, and converts the digital image signal DAT to an analog data signal by selecting a gray voltage corresponding to each digital image signal DAT according to the data control signal CONT2 from the signal controller 600. Then, the analog data signal is supplied to corresponding data lines D1-Dm.

The gate driver 400 supplies a gate-on voltage Von to gate lines $G_1$-$G_n$ according to a gate control signal CONT1 from the signal controller 600, thereby turning on a switching element Q connected to the gate lines $G_1$-$G_n$. Then, the data signal supplied to the data lines $D_1$-$D_m$ is supplied to a corresponding pixel PX through the turned-on switching element Q.

The difference between a voltage of a data signal supplied to a pixel PX and a common voltage Vcom is shown as a charge voltage of a liquid crystal capacitor Clc, that is, a pixel voltage. Liquid crystal molecules vary their arrangement according to the level of the pixel voltage, and vary the polarization of light passing through the liquid crystal layer 3 according to the variation of the liquid crystal molecule arrangement. Such a polarization variation is shown as a transmittance variation of light by a polarizer attached to the display panel assembly 300, and the pixel PX displays luminance expressing the gray of the image signal DAT.

By repeating the above described operation in a unit of 1 horizontal period ("1H") which is equivalent to one cycle of a horizontal synchronizing signal Hsync and a data enable signal DE, the gate-on voltage Von is sequentially provided to all of the gate lines $G_1$-$G_n$ and an image of one frame is displayed by supplying the data signals to all of the pixels PX.

After displaying the image of one frame, the next frame starts and the state of the inversion signal RVS supplied to the data driver 500 is controlled to invert the polarity of the data signal from the previous frame ("frame inversion"). Herein, the polarity of a data signal flowing through a data line can be inverted according to a characteristic of the inversion signal RVS even within one frame (for example, row inversion, dot inversion), or the polarity of the data signal supplied to one pixel can be different (for example column inversion, dot inversion).

Hereinafter, the liquid crystal panel assembly 300 according to an embodiment of the present invention will be described with reference to FIGS. 3 to 7.

Figure 3:
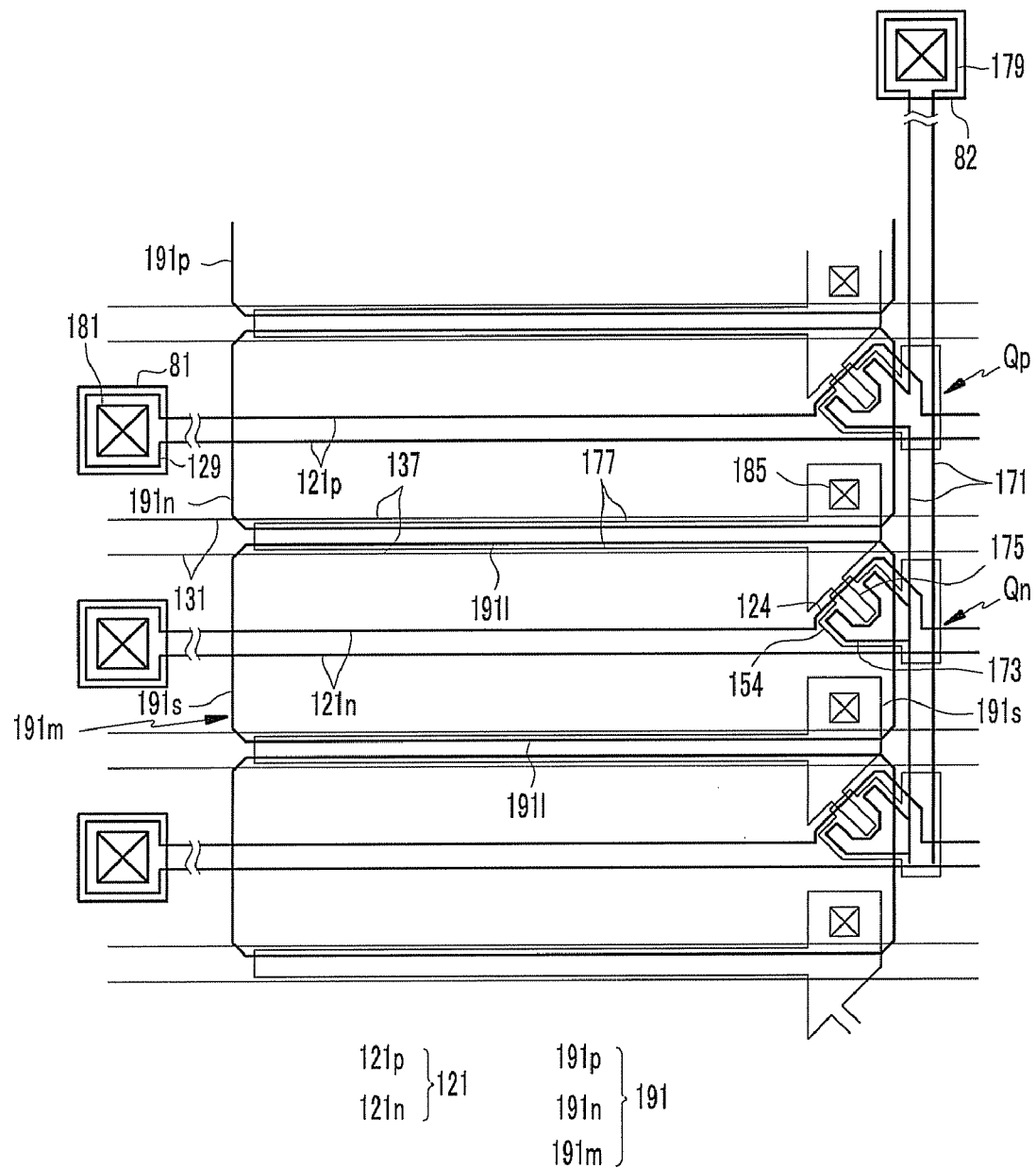
FIG. 3 is a plan view layout of a thin film transistor array panel for a liquid crystal panel assembly according to an exemplary embodiment of the present invention.
Figure 4:
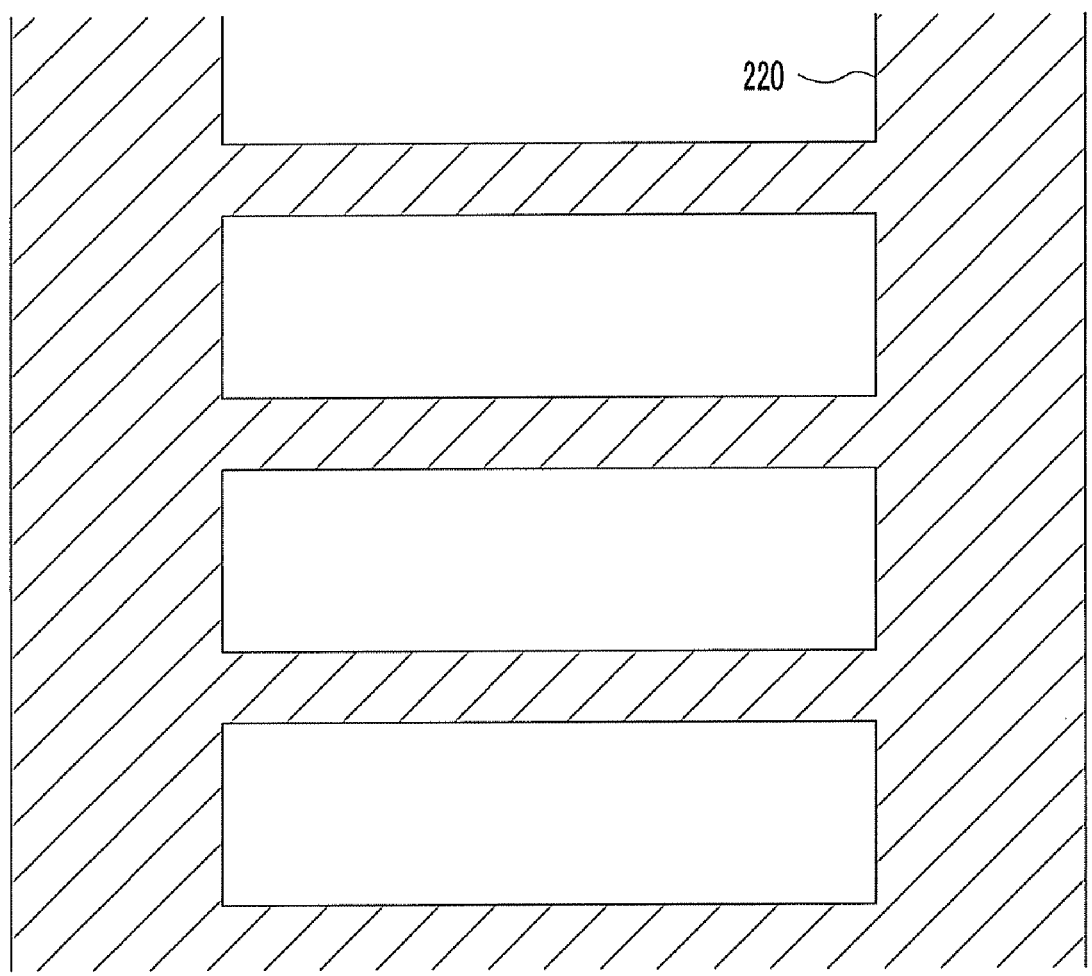
FIG. 4 is a plan view layout of a common electrode panel for a liquid crystal panel assembly according to an exemplary embodiment of the present invention.
Figure 5:
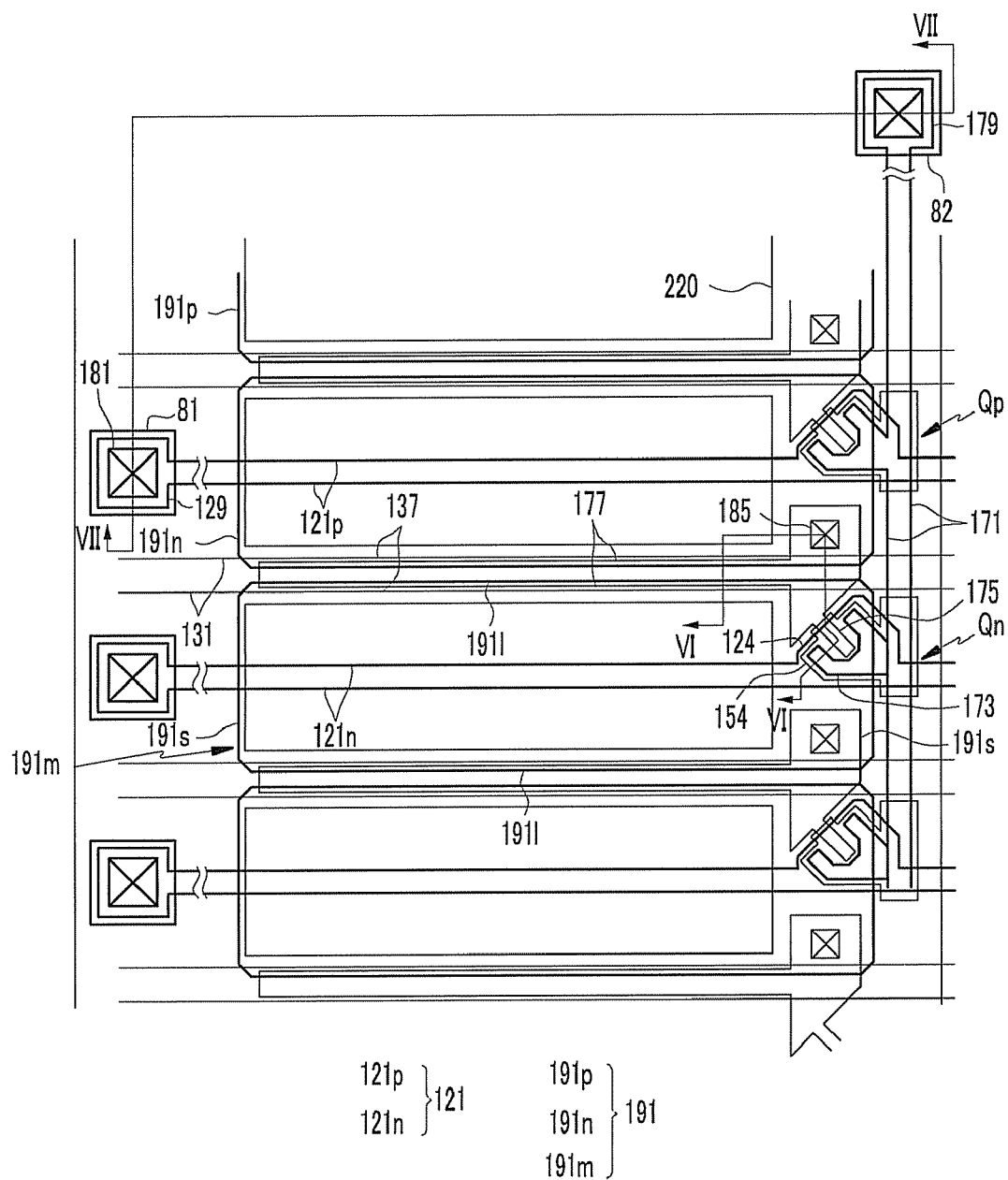
FIG. 5 is a plan view layout of a liquid crystal panel assembly including a thin film transistor array panel shown in FIG. 3 and a common electrode panel shown in FIG. 4.
Figure 6:
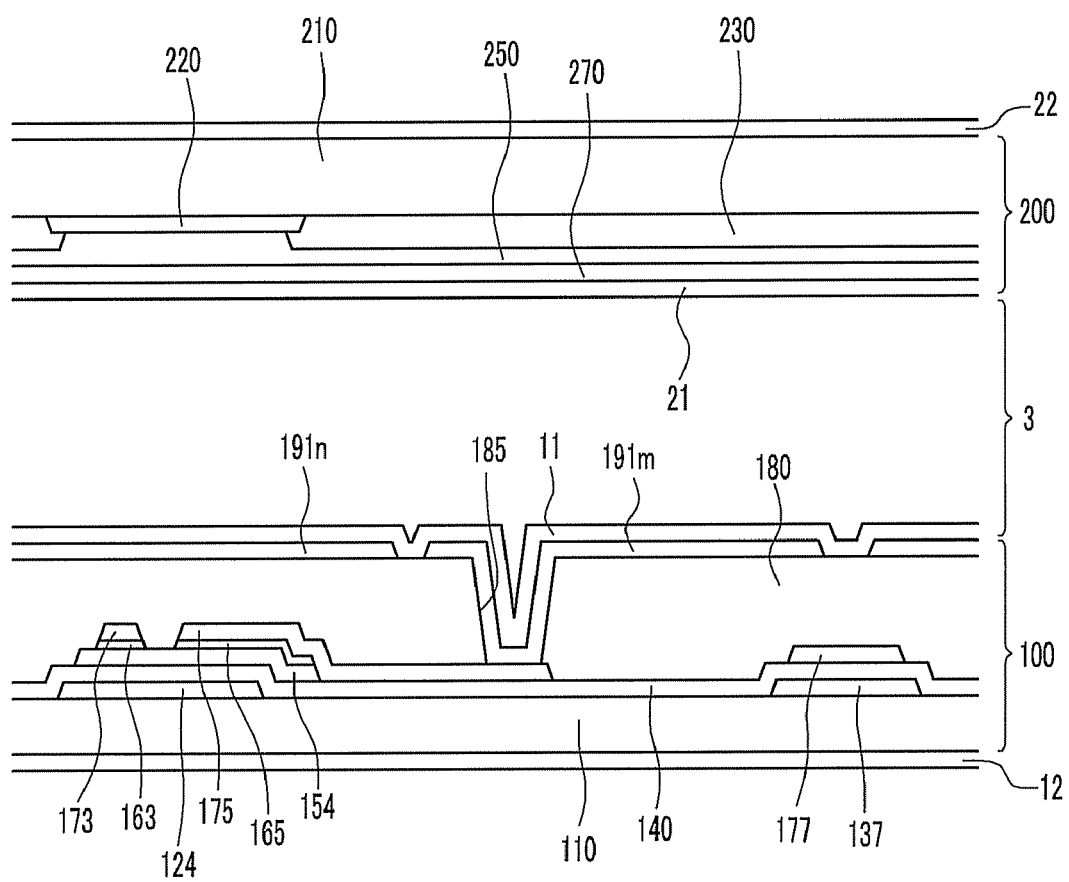
FIG. 6 and FIG. 7 are cross-sectional views of the liquid crystal display shown in FIG. 5 taken along lines VI-VI and VII-VII, respectively.
Figure 7:
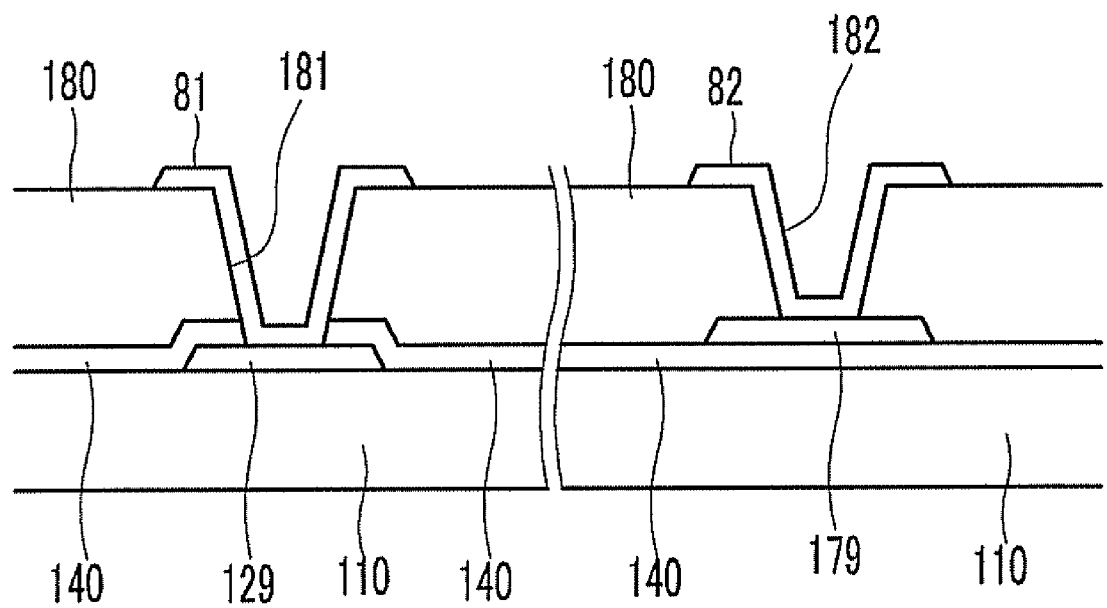

FIG. 3 is a plan view layout illustrating a thin film transistor array panel for a liquid crystal panel assembly according to an exemplary embodiment of the present invention. FIG. 4 is a plan view layout illustrating a common electrode panel for a liquid crystal panel assembly according to an exemplary embodiment of the present invention. FIG. 5 is a plan view layout view illustrating a liquid crystal panel assembly formed of a thin film transistor array panel shown in FIG. 3 and a common electrode panel shown in FIG. 4. FIGS. 6 and 7 are cross-sectional views of a liquid crystal panel assembly shown in FIG. 5 taken along lines VI-VI and VII-VII, respectively.

First, a thin film transistor array panel for a liquid crystal panel assembly according to an exemplary embodiment of the present invention will be described with reference to FIGS. 3, 5, 6 and 7.

A plurality of gate lines 121 and storage electrode lines 131 are formed on an insulation substrate 110 made of transparent glass or plastic.

The gate lines 121 transfer a gate signal and basically extend in a horizontal direction, as illustrated in FIGS. 3 and 5. Each gate line 121 includes a plurality of gate electrodes 124 protruding upwardly and downwardly, and a wide end 129 for contacting other layers or an external driving circuit (not shown).

Each storage electrode line 131 receives a predetermined voltage such as a common voltage, and extends in parallel with the gate lines 121. The storage electrode line 131 includes a storage electrode 137. However, the shape and arrangement of the storage electrode lines 131 can be modified.

The gate lines 121 and the storage electrode lines 131 can be made of an aluminum group metal such as aluminum (Al) and an aluminum alloy, a silver group metal such as silver (Ag) and a silver alloy, a copper group metal such as copper (Cu) and a copper alloy, a molybdenum group metal such as molybdenum (Mo) and a molybdenum alloy, chromium (Cr), tantalum (Ta), or titanium (Ti). However, they can have a multilayer structure having two conductive layers (not shown) with different physical properties. A conductive layer among them can be made of a metal having low resistivity, for example an aluminum group metal, a silver group metal, or a copper group metal in order to reduce signal delay or voltage drop. On the contrary, the other conductive layer can be made of a different material having excellent physical, chemical and electrical contact characteristics to indium tin oxide ("ITO") and indium zinc oxide ("IZO"), for example a molybdenum group metal, chromium, tantalum, or titanium. For example, such a composition can be a chromium lower layer and an aluminum (alloy) upper layer, or an aluminum (alloy) lower layer and a molybdenum (alloy) upper layer. However, the gate line 121 and storage electrode line 131 can be made of various metals or conductors besides the materials described above.

It is desirable that the sides of the gate lines 121 and storage electrode lines 131 are inclined relative to the substrate 110, and the inclination angle is about 30° to about 80°.

A gate insulating layer 140 made of silicon nitride ("SiNx") or silicon oxide ("SiOx") is formed on the gate lines 121 and the storage electrode lines 131.

A plurality of semiconductor islands 154 made of hydrogenated amorphous silicon ("a-Si") or polysilicon are formed on the gate insulating layer 140. A semiconductor 154 is formed on the gate electrode 124, as illustrated in FIGS. 3, 5 and 6.

A plurality of ohmic contact islands (ohmic contacts) 163 and 165 are formed on the semiconductor 154. The ohmic contacts 163 and 165 are made of n+ hydrogenated amorphous silicon doped with a highly concentrated n-type impurity such as phosphor, or of silicide. The ohmic contacts 163 and 165 are paired on the semiconductor 154.

The sides of the semiconductor 154 and the ohmic contacts 163 and 165 are also inclined relative to the substrate 110, and the inclination angle therebetween is about 30° to about 80°.

A plurality of data lines 171 and a plurality of drain electrodes 175 are formed on the ohmic contacts 163 and 165 and the gate insulating layer 140.

The data lines 171 transfer a data signal and basically extend in a vertical direction, thereby intersecting the gate lines 121, as illustrated in FIGS. 3 and 5. Each data line 171 includes a plurality of source electrodes 173 extending toward the gate electrode 124 and a wide end 179 for contacting another layer or an external driving circuit (not shown). A data driving circuit (not shown) generating a data signal can be mounted on a flexible printed circuit film (not shown) attached to the substrate 110, directly on the substrate 110, or integrated with the substrate 110. When the data driving circuit is integrated with the substrate 110, the data line 171 can extend to directly connect thereto.

The drain electrodes 175 are separated from the data lines 171 and face a source electrode 173 interposing the gate electrode 124 therebetween. Each drain electrode 175 includes one wide end 177 and one rod-shaped end. The wide end 177 is overlapped with a storage electrode 137, and the rod-shaped end is partially surrounded by the U shaped source electrode 173.

One gate electrode 124, one source electrode 173 and one drain electrode 175 form a thin film transistor ("TFT") with a semiconductor 154, and the channel of the thin film transistor is formed between the source electrode 173 and the drain electrode 175 on the semiconductor 154.

It is desirable that the data lines 171 and drain electrodes 175 are made of a refractory metal such as molybdenum, chromium, tantalum, titanium, or alloys comprising at least one of the foregoing metals, and have a multilayer structure made of a refractory metal layer (not shown) and a conductive layer (not shown). For example, the multilayer structure may be a dual-layer structure made of a chromium or molybdenum (alloy) lower layer and an aluminum (alloy) upper layer, or a triple-layer structure made of a molybdenum (alloy) lower layer, an aluminum (alloy) middle layer, and a molybdenum (alloy) upper layer. However, the data lines 171 and drain electrodes 175 can be made of various metals or conductors besides the materials described above.

It is desirable that the data line 171 and drain electrode 175 are also inclined relative to the substrate 110, and the inclination angle is about 30° to about 80°.

The ohmic contacts 163 and 165 are only present between the semiconductors 154 disposed thereunder and the data lines 171 and drain electrodes 175 disposed thereabove, and reduce the contact resistive therebetween. Each semiconductor 154 includes an exposed region which is not covered by a data line 171 and a drain electrode 175, such as a region between the source electrode 173 and the drain electrode 175.

A passivation layer 180 is formed on the data line 171, the drain electrode 175 and the exposed portion of the semiconductor 154. The passivation layer 180 is made of an inorganic insulator such as silicon nitride or silicon oxide. The passivation layer 180 can be made of an organic insulator, and the surface thereof can be flat. In the case of the organic insulator, the passivation layer 180 can have photosensitivity, and it is desirable that the dielectric constant thereof is less than about 4.0. The passivation layer 180 can have a dual-layer structure made of a lower inorganic layer and an upper organic layer at the exposed region of the semiconductor 154 in order to sustain the inorganic layer's excellent insulating characteristic and to not damage the exposed region of the semiconductor 154.

A plurality of contact holes 182 and 185 are formed in the passivation layer 180 to expose the ends 179 of the data lines 171, and the drain electrodes 175, and a plurality of contact holes 181 are formed in the passivation layer 180 and the gate insulating layer 140 to expose the ends 129 of the gate lines 121.

A plurality of pixel electrodes 191, a plurality of connecting members 81 and a plurality of contact assistants 82 are formed on the passivation layer 180. They can be made of a transparent conductive material such as ITO or IZO, or a reflective metal such as aluminum, silver, chromium, or alloys comprising at least one of the foregoing metals.

Each pixel electrode 191 has four sides disposed substantially in parallel with the gate line 121 or the data line 171. Among them, the two vertical sides 191*l* parallel with the gate line 121 are longer than the two horizontal sides 191*s*, and the two vertical sides 191*l* are three times longer than the two horizontal sides 191*s*, as best seen with reference to FIGS. 3 and 5. Therefore, compared to a case having a vertical side shorter than a horizontal side, the number of pixel electrodes 191 disposed at each column is smaller than the number of pixel electrodes 191 disposed at each row. Therefore, since the overall number of data lines 171 is reduced, the material cost can be reduced by reducing the number of IC chips for the data driver 500. Although the number of gate lines 121 increases, the increase of the gate lines 121 does not become a major problem because the gate driver 400 can be integrated with the assembly 300 having the gate lines 121, data lines 171, and thin film transistors. Although the gate driver 400 is mounted as an IC chip, it is more cost effective to reduce the number of IC chips for data driver 500 because the price of the IC chips for the gate driver 400 is comparatively cheaper.

The pixel electrode 191 is physically and electrically connected to the drain electrode 175 through the contact hole 185, and receives a data voltage from the drain electrode 175 (FIG. 6). The pixel electrode 191 receiving a data voltage induces an electric field with the common electrode 270 of the common electrode panel 200. Thereby, the electric field determines the direction of the liquid crystal molecules of the liquid crystal layer 3 between the two electrodes 191 and 270. The polarization of the light passing through the liquid crystal layer 3 varies according to the determined direction of the liquid crystal molecules. The pixel electrode 191 and common electrode 270 sustain the supplied voltage by forming a liquid crystal capacitor after the respective thin film transistor is turned off.

The pixel electrode 191 forms a storage capacitor which enhances the voltage sustaining capability of the liquid crystal capacitor by being overlapped with the storage electrode line 131 and the storage electrode 137. In more detail, the storage electrode 137 of the storage electrode line 131 horizontally crosses two adjacent pixel electrodes 191*n* and 191*p*, and overlaps two pixel electrodes 191*n* and 191*p*, as best seen with reference to FIGS. 3 and 5. The storage electrode 137 blocks light leakage between the pixel electrodes 191.

Referring to FIGS. 3 and 5, the pixel electrodes 191 also overlap the gate lines 121. In more detail, a gate line 121*p* connected to a gate electrode 124 of a thin film transistor Qp connected to the first pixel electrode 191p which is placed on the top between two pixel electrodes 191n and 191p adjacent in a column direction does not overlap the first pixel electrode 191n. The gate line 121p is overlapped with the second pixel electrode 191n. A gate line 121n connected to a gate electrode 124 of a thin film transistor (Qn) connected to the lower pixel electrode 191n is overlapped by the third pixel electrode 191m adjacent to and under the second pixel electrode 191n.

As described above, a storage electrode line 131 is formed between pixel electrodes 191, and the gate line 121 is overlapped with the adjacent pixel electrodes 191, thereby reducing a kickback voltage and increasing an aperture ratio.

Contact assistants 82 are connected to the ends 179 of the data lines 171 through contact holes 182. The contact assistants 82 complement adhesion between the ends 179 of the data lines 171 and an external device (not shown) and protect them.

A connecting member 81 is connected to the wide end 129 of the gate line 121 through the contact hole 181. The connecting member 81 connects the wide end 129 of the gate line 121 and the gate driver 400. If the gate driver 400 is of the IC chip type, the connecting member 81 can have a shape and function similar to those of the contact assistants 82.

Hereinafter, a common electrode panel 200 will be described with reference to FIGS. 4 to 6.

A light blocking member 220 is formed on an insulation substrate 210 made of transparent glass or plastic. The light blocking member 220 is also called a black matrix, and blocks light leakage.

A plurality of color filters 230 are formed on the substrate 210 and light blocking member 220. The color filters 230 are mostly formed in a region surrounded by the light blocking member 220, and extend along the line of the pixel electrode 191. Each of the color filters 230 can display one of three primary colors, such as, red, green and blue, for example, but is not limited thereto.

An overcoat 250 is formed on the color filters 230 and the light blocking member 220. The overcoat 250 can be made of an organic insulator. Such an overcoat 250 prevents the color filters 230 from being exposed and provides a flat surface. A common electrode 270 is formed on the overcoat 250. The overcoat 250 can be omitted in alternative exemplary embodiments.

Alignment layers 11 and 21 are coated on the inside surfaces of the display panels 100 and 200, and they can be vertical alignment layers. Polarizers 12 and 22 are provided at the outer surface of the display panels 100 and 200, respectively, and the polarization axis of the two polarizers can be in parallel with or cross each other. In the case of a reflective liquid crystal display, one of the two polarizers can be omitted.

The liquid crystal display according to the present exemplary embodiment can further include a phase retardation film (not shown) to correct the delay of the liquid crystal layer 3. The liquid crystal display can include the polarizers 12 and 22, a phase retardation film, the display panels 100 and 200, and a lighting unit for providing light to a liquid crystal layer 3.

The liquid crystal layer 3 has positive or negative dielectric anisotropy, so the liquid crystal molecules of the liquid crystal layer 3 are arranged to have a longitudinal axis which is parallel with or vertical to the surface of the two display panels 100 and 200 in a state of no electric field being applied.

Hereinafter, a liquid crystal panel assembly according to another exemplary embodiment of the present invention will be described with reference to FIGS. 8 and 9.

Figure 8:
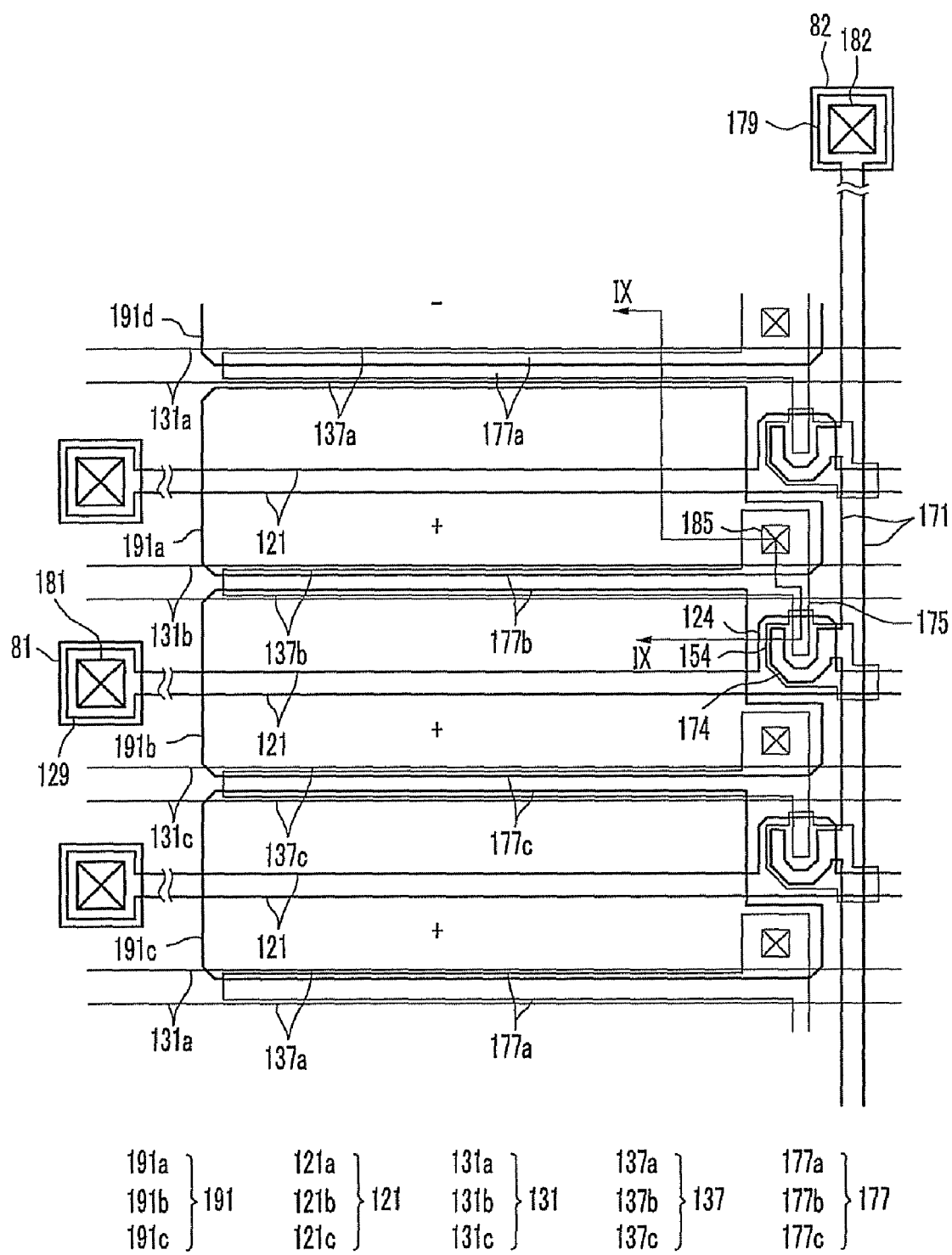
FIG. 8 is a plan view layout of a liquid crystal display according to another exemplary embodiment of the present invention.
Figure 9:
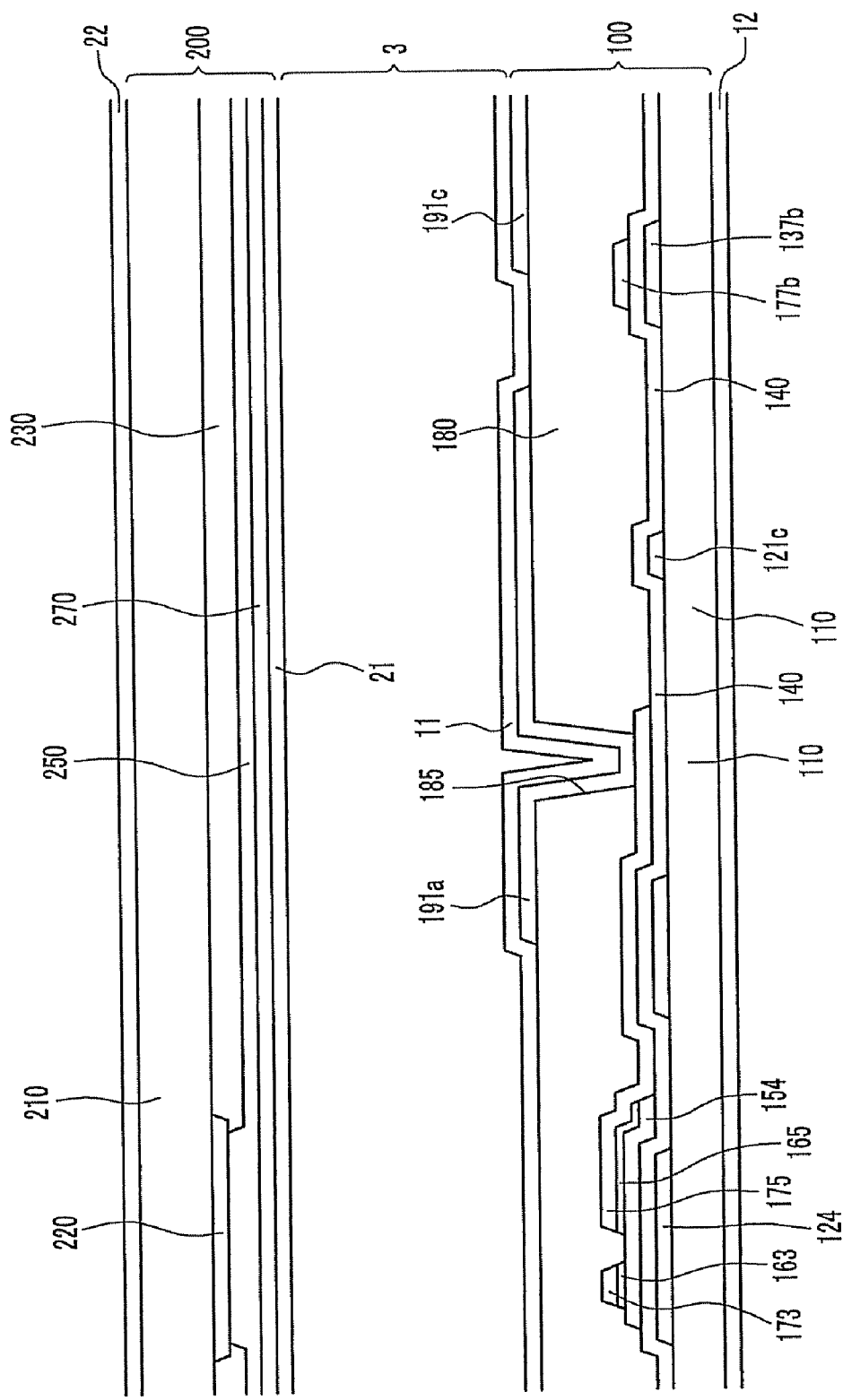
FIG. 9 is a cross-sectional view of the liquid crystal display shown in FIG. 8 taken along line IX-IX.

FIG. 8 is a plan view layout illustrating a liquid crystal panel assembly according to another exemplary embodiment of the present invention. FIG. 9 is a cross-sectional view illustrating a liquid crystal panel assembly shown in FIG. 8 taken along line IX-IX.

The liquid crystal panel assembly according to the present alternative exemplary embodiment includes a thin film transistor array panel 100, a common electrode panel 200 facing the thin film transistor array panel 100 and a liquid crystal layer 3 interposed between the two display panels 100 and 200.

The layered structure of the liquid crystal panel assembly according to the present alternative exemplary embodiment is approximately identical to the layered structure of the liquid crystal panel assembly shown in FIGS. 3 to 6.

The lower panel 100 will be described hereinafter. A plurality of gate conductors having a plurality of gate lines 121 and storage electrode lines 131a and 131b are formed on an insulation substrate 110. Each gate line 121 includes a wide end 129 of the gate electrode 124, and each storage electrode line 131a and 131b includes a storage electrode 137a and 137b, respectively. A gate insulating layer 140 is formed on a gate conductor 121. A semiconductor island 154 is formed on the gate insulating layer 140, and a plurality of ohmic contacts 163 and 165 are formed thereon. A data conductor having a plurality of data lines 171 and a plurality of drain electrodes 175 is formed on the ohmic contacts 163 and 165 and gate insulating layer 140. Each data line 171 includes an end 179 of a plurality of source electrodes 173. A passivation layer 180 is formed on the data conductors 171 and 175 and the exposed region of the semiconductor 154, and a plurality of contact holes 181, 182 and 185 are formed on the passivation layer 180 and gate insulating layer 140. A plurality of pixel electrodes 191 and a plurality of contact assistants 81 and 82 are formed on the passivation layer. An alignment layer 11 is formed on the pixel electrode 191, the contact assistants 81 and 82, and the passivation layer 180.

Hereinafter, the upper panel will be described. A light blocking member 220, a plurality of color filters 230, an overcoat 250, a common electrode 270 and an alignment layer 21 are formed on an insulation substrate 210.

The liquid crystal panel assembly shown in FIG. 8 inversely drives a data voltage supplied from the data driver 500 to the data line 171 in a 3×1 manner. If three pixel electrodes adjacent in a row direction are the first pixel electrode 191a, the second pixel electrode 191b and the third pixel electrode 191c, and if a pixel electrode adjacent to the upper region of the first pixel electrode 191a is the fourth pixel electrode 191d, the voltage polarities of the first to third pixel electrodes 191a, 191b and 191c are positive (+) and the voltage polarity of the fourth pixel electrode 191d is negative (−).

A drain electrode 177a overlapping a storage electrode line 131a between the first pixel electrode 191a and the fourth pixel electrode 191d is overlapped with only one of the first and fourth pixel electrode 191a and 191d. That is, if the voltage polarities of the adjacent two pixel electrodes 191a and 191d are different, the drain electrode 177a is overlapped with only one of two pixel electrodes 191a and 191d.

On the contrary, the drain electrode 177b overlapping a storage electrode line 131b formed between the first pixel electrode 191a and the second pixel electrode 191b is overlapped with both of the first and second pixel electrodes 191a and 191b. A drain electrode 177c overlapping a storage electrode line 131c formed between the second pixel electrode 191b and the third pixel electrode 191c is also overlapped with both of the second and third pixel electrodes 191b and 191c. That is, if the voltage polarity of two adjacent pixel electrodes 191*a* and 191*b*, or 191*b* and 191*c*, are the same, the drain electrodes 177*b* and 177*c* are overlapped with both of two pixel electrodes (191*a* and 191*b*, or 191*b* and 191*c*).

When the voltage polarities of two adjacent pixel electrodes 191 are opposite, the voltage difference between two pixel electrodes 191 is large. If the drain electrode 177 is overlapped with both of two adjacent pixel electrodes 191, in this case, a parasitic capacitance is induced between each pixel electrode 191 and the drain electrode 177. The parasitic capacitance influences the voltages of the two adjacent pixel electrodes, thereby causing pixel quality deterioration. Accordingly, if the polarities of two adjacent pixel electrodes 191 are identical as in the present invention, an aperture ratio can be secured by overlapping the drain electrode 177 with two pixel electrodes 191. If polarities of two adjacent pixel electrodes 191 are opposite, the pixel quality deterioration can be prevented by overlapping the drain electrode 177 with one of the pixel electrodes 191.

The liquid crystal panel assembly according to the present alternative exemplary embodiment was described on a basis of a 3×1 inversion drive. However, the present invention is not limited thereto. The present invention can be applied to an m×1 inversion drive, where m is an integer greater than 2. That is, if the polarities of adjacent pixel electrodes 191 are opposite in the case of an m×1 inversion drive, the drain electrode 177 is overlapped with only one of the pixel electrodes 191. If the polarities of adjacent pixel electrodes 191 are the same, the drain electrode 177 is overlapped with both of two pixel electrodes 191.

According to the present invention, the number of data driving circuit chips disposed on the liquid crystal display can be reduced, cross-talk can be prevented and the aperture ratio can be secured.

While this invention has been described in connection with what is presently considered to be practical exemplary embodiments, it is to be understood that the present invention is not limited to the disclosed exemplary embodiments, but, on the contrary, is intended to cover various modifications and equivalent arrangements included within the spirit and scope of the appended claims.

What is claimed is:

1. A liquid crystal display comprising: a substrate; a plurality of gate lines formed on the substrate; a plurality of data lines crossing the gate lines; a plurality of thin film transistors connected to the gate lines and the data lines, and each thin film transistor including a drain electrode; a plurality of pixel electrodes connected to the thin film transistors, arranged in a matrix, and each pixel electrode having a first side disposed in parallel with the gate lines and a second side shorter than the first side and adjacent to the first side; and a data driver coupled to the data lines applies a voltage having positive polarity or negative polarity to the pixel electrodes, wherein a predetermined portion of each of the drain electrodes is disposed between adjacent pixel electrodes and the drain electrodes include a first drain electrode and second drain electrode, the predetermined portion of the first drain electrode is overlapped with only one of the adjacent pixel electrodes if the polarities of the adjacent pixel electrodes are different, and the predetermined portion of the second drain electrode is overlapped with both of the adjacent pixel electrodes if the polarities of the adjacent pixel electrodes are the same, wherein the polarities of the pixel electrodes are driven in an m×1 inversion-drive manner, and wherein the m is an integer greater than 2.

2. The liquid crystal display of claim is wherein the m is 3.

3. The liquid crystal display of claim 1, further comprising a storage electrode line overlapped with a respective pixel electrode and drain electrode.

4. The liquid crystal display of claim 3, wherein predetermined portions of each of the drain electrodes and the storage electrode line are disposed between adjacent pixel electrodes in a column direction.

5. The liquid crystal display of claim 1, wherein each pixel electrode covers a previous gate line.

6. The liquid crystal display of claim 1, further comprising an organic layer formed between each pixel electrode and the data lines, and between each pixel electrode and the gate lines.

7. The liquid crystal display of claim 1, wherein the length of the first side is three times longer than that of the second side.

8. The liquid crystal display of claim 1, further comprising a gate driver connected to the gate lines, wherein the gate driver is placed on the substrate on which the gate lines, the data lines and the thin film transistors are formed.

9. A liquid crystal display comprising: a substrate; a plurality of gate lines formed on the substrate; a plurality of data lines crossing the gate lines; a plurality of thin film transistors connected to the gate lines and the data lines; and first, second and third pixel electrodes, which are connected to the thin film transistors, respectively, each of the first, second and third pixel electrodes having a first side disposed in parallel with the gate lines and a second side adjacent to and shorter than the first side, and are adjacent in a column direction, wherein polarities of the second and third pixel electrodes are the same, and the polarity of the first pixel electrode is opposite to the polarity of the second and third pixel electrodes, wherein a first drain electrode is disposed between the respective first sides of the first and second pixel electrodes, and a second drain electrode is disposed between the respective first sides of the second and third pixel electrodes, and wherein the first drain electrode is overlapped only with the first pixel electrode of the first, second and third pixel electrodes, and the second drain electrode is overlapped with both of the second and third pixel electrodes.

10. The liquid crystal display of claim 9, further comprising a storage electrode line overlapped with corresponding pixel and drain electrodes.

11. The liquid crystal display of claim 9, wherein each of the first, second and third pixel electrodes covers a previous gate line.

12. The liquid crystal display of claim 9, further comprising an organic layer formed between each of the first, second and third pixel electrodes and the data lines, and between each of the first, second and third pixel electrodes and the gate lines.

13. The liquid crystal display of claim 9, wherein the length of the first side is three times longer than that of the second side.

14. The liquid crystal display of claim 9, further comprising a gate driver connected to the gate lines, wherein the gate driver is placed on the substrate on which the gate lines, the data lines and the thin film transistors are formed.

15. The liquid crystal display of claim 1, wherein the first drain electrode overlaps only one pixel electrode of a pair of adjacent pixel electrodes being driven with different polarities and the second drain electrode overlaps both pixel electrodes of a pair of adjacent pixel electrodes being driven with same polarities.

* * * * *